(12) United States Patent
Moon et al.

(10) Patent No.: US 10,424,649 B2
(45) Date of Patent: Sep. 24, 2019

(54) SEMICONDUCTOR DEVICE (71) Applicant: SAMSUNG ELECTRONICS CO., LTD., Suwon-si, Gyeonggi-Do (KR)

(72) Inventors: Joon-Seok Moon, Seongnam-si (KR);
Dong Sik Kong, Hwaseong-si (KR);
Sung Won Yoo, Suwon-si (KR); Hee Sun Joo, Seoul (KR); Kyo-Suk Chae, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/026,097

(22) Filed: Jul. 3, 2018

(65) Prior Publication Data

US 2019/0165122 A1    May 30, 2019

(30) Foreign Application Priority Data

Nov. 29, 2017    (KR) .......................... 10-2017-0161292

(51) Int. Cl.
| | | |
|---|---|---|
| *H01L 29/51* | (2006.01) | |
| *H01L 29/423* | (2006.01) | |
| *H01L 29/78* | (2006.01) | |
| *H01L 27/108* | (2006.01) | |

(52) U.S. Cl.
CPC ........ *H01L 29/513* (2013.01); *H01L 29/4236* (2013.01); *H01L 29/7827* (2013.01); *H01L 27/10823* (2013.01)

(58) Field of Classification Search
CPC .............. H01L 29/513; H01L 29/4236; H01L 29/7827; H01L 27/10823
See application file for complete search history.

(56) References Cited

U.S. PATENT DOCUMENTS

| | | |
|---|---|---|
| 8,860,174 B2 | 10/2014 | Smith et al. |
| 8,896,059 B1 | 11/2014 | Kim |
| 8,901,630 B2 | 12/2014 | Huh et al. |
| 9,331,072 B2 | 5/2016 | Seo et al. |
| 9,496,360 B2 | 11/2016 | Masuoka et al. |
| 9,508,847 B2 | 11/2016 | Oh et al. |
| 9,577,052 B2 | 2/2017 | Oh |
| 9,634,011 B2 | 4/2017 | Kang et al. |
| 9,634,109 B2 | 4/2017 | Oh et al. |

(Continued)

*Primary Examiner* — Karen Kusumakar
(74) *Attorney, Agent, or Firm* — Volentine, Whitt & Francos, PLLC (57) ABSTRACT

A semiconductor device includes a substrate, device isolation film defining an active region of the substrate in which a gate trench extends, a gate insulating film disposed along sides and a bottom of the gate trench, a gate electrode disposed on the gate insulating film in the gate trench and having a first portion, a second portion on the first portion, and a third portion on the second portion, a first barrier film pattern interposed between the first portion of the gate electrode and the gate insulating film, a second barrier film pattern interposed between the second portion of the gate electrode and the gate insulating film, and a third barrier film pattern interposed between the third portion of the gate electrode and the gate insulating film. The work function of the first barrier film pattern is greater than the work function of the second barrier film pattern and less than the work function of the third barrier film pattern.

13 Claims, 10 Drawing Sheets

(56) References Cited

U.S. PATENT DOCUMENTS

| | | | |
|---|---|---|---|
| 2002/0135007 A1* | 9/2002 | Koike | H01L 27/10829 |
| | | | 257/301 |
| 2014/0367774 A1* | 12/2014 | Yoo | H01L 29/4236 |
| | | | 257/330 |
| 2015/0214362 A1* | 7/2015 | Oh | H01L 29/7827 |
| | | | 257/330 |
| 2017/0117190 A1 | 4/2017 | Chung et al. | |
| 2017/0186844 A1 | 6/2017 | Kim et al. | |
| 2018/0174845 A1* | 6/2018 | Jang | H01L 29/66666 |

\* cited by examiner

SEMICONDUCTOR DEVICE

PRIORITY STATEMENT

This application claims the benefit of Korean Patent Application No. 10-2017-0161292, filed on Nov. 29, 2017, in the Korean Intellectual Property Office, the disclosure of which is hereby incorporated by reference in its entirety.

BACKGROUND

1. Field of the Inventive Concept

The present inventive concept relates to semiconductor devices and in particular, to semiconductor memory devices. More particularly, the inventive concept a semiconductor device having a transistor whose gate electrode is disposed within an active region, such as a recessed or buried channel array transistor (BCAT).

2. Description of the Related Art

As dynamic random access memory (DRAM) devices have been scaled down and integrated to a very high degree, the influence of leakage current on adjacent word lines has increased. Also, when a high voltage is applied to a word line of a DRAM device, if electric charge leaks from the word line, the sensing of a memory cell constituted by the word line may be unreliable.

In addition, a buried channel array transistor (BCAT) has been developed for use in DRAMs to obviate known short channel effects that are more likely to occur as the DRAMs become more highly integrated. A BCAT includes a gate electrode disposed in a trench in a substrate so that the gate electrode is "buried" in the substrate.

SUMMARY

According to the inventive concept, there is provided a semiconductor device comprising a substrate and a device isolation film defining an active region of the substrate, the active region having a gate trench therein, a gate insulating film disposed along sides and a bottom of the gate trench, a gate electrode disposed on the gate insulating film and occupying at least a part of the gate trench not occupied by the gate insulating film, the gate electrode having a first portion, a second portion on the first portion, and a third portion on the second portion, a first barrier film pattern interposed between the first portion of the gate electrode and the gate insulating film, the first barrier film pattern having a first work function, a second barrier film pattern interposed between the second portion of the gate electrode and the gate insulating film, the second barrier film pattern having a second work function, a third barrier film pattern interposed between the third portion of the gate electrode and the gate insulating film, the third barrier film pattern having a third work function, and in which the first work function is larger than the third work function and smaller than the second work function.

According to the inventive concept, there is also provided a semiconductor device comprising a substrate and a device isolation film defining an active region of the substrate, the active region having a gate trench therein, a gate insulating film disposed along sides and a bottom of the gate trench, a gate electrode disposed on the gate insulating film and occupying at least a part of the gate trench not occupied by the gate insulating film, the gate electrode having a first portion, a second portion on the first portion, and a third portion on the second portion, a first barrier film pattern of first material interposed between the first portion of the gate electrode and the gate insulating film, a second barrier film pattern of second material interposed between the second portion of the gate electrode and the gate insulating film, and a third barrier film pattern of third material interposed between the third portion of the gate electrode and the gate insulating film, and in which the first and second materials having oxygen areal densities wherein the oxygen areal density of the second material is greater than the oxygen areal density of the first material.

According to the inventive concept, there is also provided a semiconductor device comprising a substrate and a device isolation film defining an active region of the substrate, the active region having a gate trench therein, a barrier film extending along at a bottom and at least part of sides of the gate trench, and a gate electrode disposed on the barrier film and occupying at least a part of the gate trench not occupied by the barrier film, and in which the barrier film has a lower barrier film pattern of a first material, an intermediate barrier film pattern of a second material disposed on the lower barrier film pattern, and an upper barrier film pattern of a third material disposed on the intermediate barrier film pattern, and the intermediate and upper barrier film patterns do not extend to the bottom of the gate trench.

According to the inventive concept, there is also provided a semiconductor device comprising a substrate having an active region, a gate electrode buried in the active region, a gate insulating film interposed between the gate electrode and the active region of the substrate, a first barrier film of material interposed between a lower portion of the gate electrode and the gate insulating film, a second barrier film of material interposed between an intermediate portion of the gate electrode and the gate insulating film and disposed above the first barrier film of material in the device, and a third barrier film of material interposed between an upper portion of the gate electrode and the gate insulating film and disposed above the second barrier film of material in the device, and in which the first barrier film of material is of one material selected from the group consisting of TiN, TaN, Ti, Ta, Mo, and Al, the second barrier film of material is of one material selected from the group consisting of aluminum oxide, titanium oxide, hafnium oxide, zirconium oxide, and magnesium oxide, and the third barrier film of material is of one material selected from the group consisting of yttrium oxide, lanthanum oxide, germanium oxide, lutetium oxide, and strontium oxide

BRIEF DESCRIPTION OF THE DRAWINGS

The above and other aspects and features of the present inventive concept will become more apparent from the detailed description of examples thereof that follows with reference to the attached drawings, in which.

DETAILED DESCRIPTION

Hereinafter, examples of semiconductor devices according to the present inventive concept will be described in detail with reference to the figures.

Figure 1:
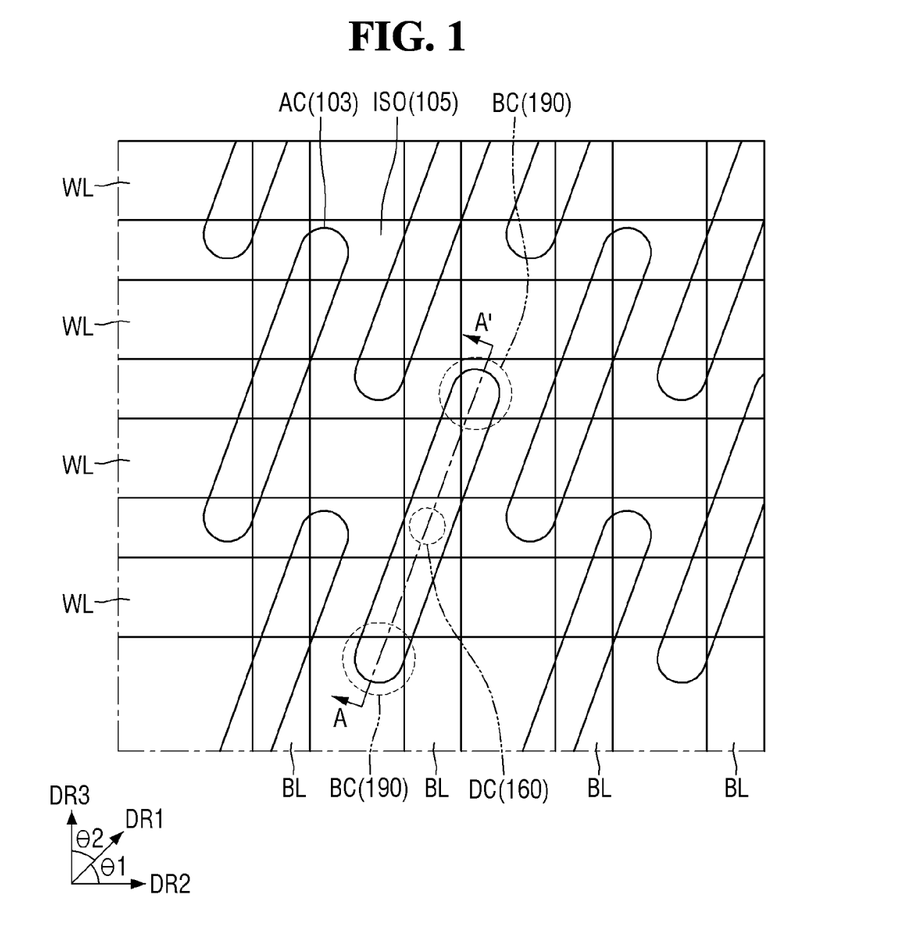
FIG. 1 is a diagram of a layout of elements in examples of semiconductor devices according to the present inventive concept.
Figure 2:
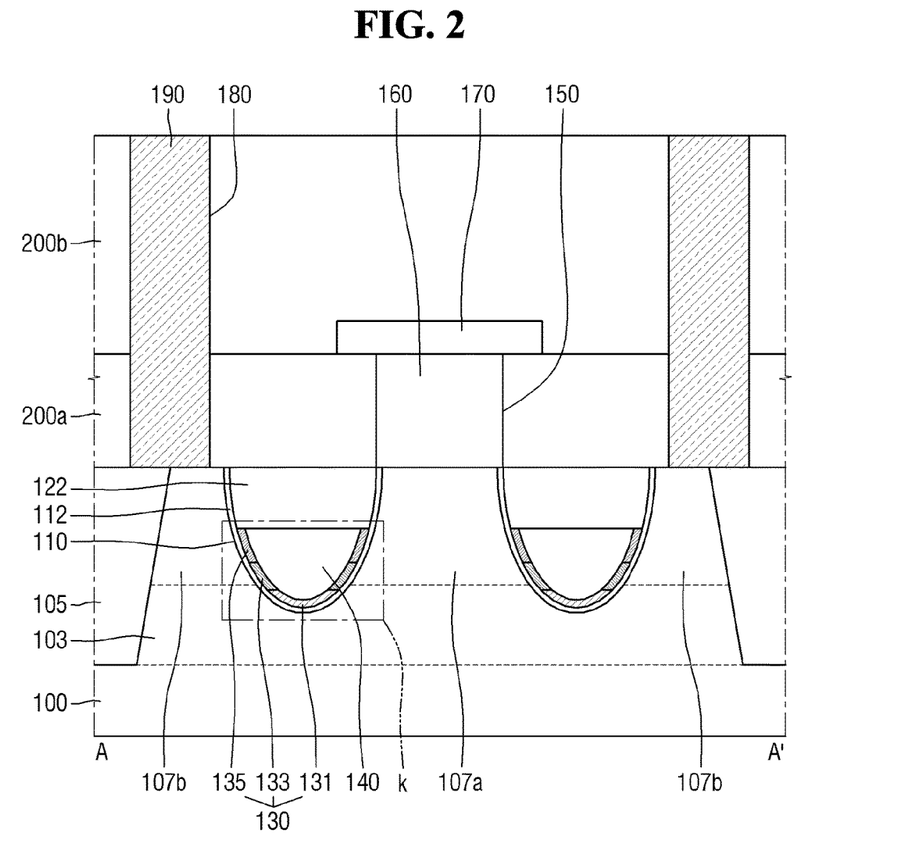
FIG. 2 is a cross-sectional view of an example of a semiconductor device according to the inventive concept, as taken along line A-A' of FIG. 1.
Figure 3:
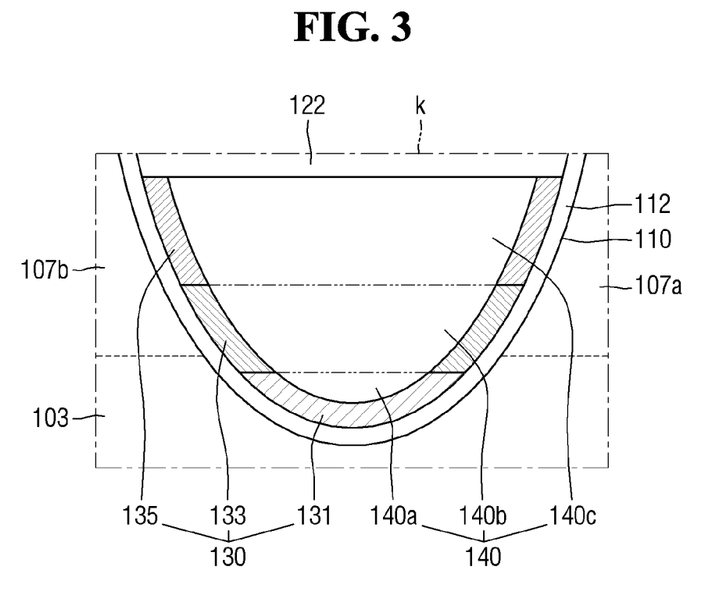
FIG. 3 is an enlarged view of a region k of FIG. 2.

Referring first to FIGS. 1 to 3, an example of semiconductor device according to the present inventive concept includes a substrate 100 having an active region (AC), an element isolation region (ISO), a word line (WL), and a bit line (BL).

The substrate 100 may be a silicon substrate or a substrate of another material such as silicon germanium, indium antimonide, a lead tellurium compound, indium arsenide, indium phosphide, gallium arsenide or gallium antimonide. Alternatively, the substrate 100 may comprise an epitaxial layer formed on a base. The substrate 100 may be a ceramic substrate, a quartz substrate, a display glass substrate, or the like, and may be an SOI (Semiconductor On Insulator) substrate such as a silicon on insulator substrate. Hereinafter, the present example will be described with reference to substrate 100 being a bulk silicon substrate.

The active region (AC) is defined by forming the element isolation region (ISO) in the substrate 100. The active region (AC) may have an isolated island shape elongated in a first direction (DR1), i.e., may extend lengthwise in a first direction. Furthermore, the gate electrode (i.e., word line (WL)) extends longitudinally in a second direction (DR2) subtending a first acute angle ($\theta 1$) with the first direction (DR1), and a bit line (BL) extends longitudinally in a third direction (DR3) subtending a second acute angle ($\theta 2$) with the first direction (DR1).

Here, the subtended angle between two directions refers to the smaller of the angles formed by the intersection of the two directions. For example, in a case in which two intersecting directions form angles of 120° and 60°, the angle "subtended" by the two directions will refer to the angle of 60°. Therefore, as illustrated in FIG. 1, the angle subtended by the first direction (DR1) and the second direction (DR2) is $\theta 1$, and the angle subtended by the first direction (DR1) and the third direction (DR3) is $\theta 2$.

In examples of semiconductor devices according to the inventive concept, $\theta 1$ and $\theta 2$ may be 45°, 45° or 30°, 60° or 60°, 30°, but the inventive concept is not limited thereto. However, the angles $\theta 1$ and/or $\theta 2$ are acute angles to maximize the spacing between a bit line contact 160 (contact connecting the active region (AC) and the bit line (BL)) and a storage node contact 190 (contact connecting the active region (AC) and the storage node).

Each active region (AC) includes a first contact region (DC) at an upper portion of an intermediate part thereof in the first direction DR1, and second contact regions (BC) at the upper portion of both ends of the active region, respectively, in the first direction DR1. That is, the first contact region (DC) is a region for being electrically connected with the bit line (BL), and the second contact region (BC) is a region for being electrically connected with a storage node. The active regions (AC) adjacent to each other in the second direction (DR2) may be formed so that the second contact regions (BC) are disposed to be adjacent to each other. In each active region (AC), the first contact region (DC) and the second contact region (BC) do not overlap each other, i.e., are spaced from each other.

A device isolation film 105 may be formed in the element isolation region (ISO). The device isolation film 105 may be formed in the substrate 100 to define the active region (AC). The device isolation film 105 may constitute a shallow trench isolation (STI) structure which is advantageous for high integration due to excellent device isolation characteristics and small occupation area, but the present inventive concept is not limited thereto. The device isolation film 105 may include at least one of silicon oxide, silicon nitride, and silicon oxynitride. Furthermore, the device isolation film 105 may have a structure in which one or more stacks of alternating layers of silicon oxide and silicon nitride are provided.

The gate trench 110 is formed in the active region 103 of the substrate 100. There gate trench 110 may have various shapes. For example, in the illustrated example, the gate trench 110 may be rounded. Alternatively, the gate trench 110 may have inclined side walls.

The gate insulating film 112 may line the sides and bottom of the gate trench 110. The gate insulating film 112 may be, for example, conformally formed along surfaces of the active region AC delimiting the gate trench 110.

The gate insulating film 112 may comprise silicon oxide, silicon nitride, or silicon oxynitride, or at least one high dielectric constant material. Examples of the high dielectric constant material include hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

A gate electrode 140 may be disposed on the gate insulating film 112 and may occupy at least a part of the gate trench 110. That is to say, the gate electrode 140 may be recessed. Specifically, the upper surface of the gate electrode 140 may be situated a level lower than that of the upper surface of the substrate 100.

The gate electrode 140 may have a first portion 140a, a second portion 140b, and a third portion 140c. The first to third portions 140a, 140b, and 140c of the gate electrode 140 are a lower portion, an intermediate portion, and an upper portion of the gate electrode 140, respectively. Specifically, the second portion 140b of the gate electrode 140 is a part of the first gate electrode 140 on the first portion 140a of the gate electrode 140, and the third portion 140c of the gate electrode 140 is a part of the gate electrode 140 on the second portion 140b of the gate electrode 140. The first to third portions 140a, 140b, and 140c of the gate electrode 140 may be contiguous as shown in FIG. 3 with the chained lines simply be used to illustrate the portions as demarcated from one another.

In some examples, all of the first to third portions 140a, 140b, and 140c of the gate electrode 140 are of the same material. Alternatively, one of the first to third portions 140a, 140b, and 140c of the gate electrode 140 may be of a different kind of material than the material of the remaining portions of the gate electrode. In still another example, the first to third portions 140a, 140b, and 140c of the gate electrode 140 are of different materials from each other. In any of these examples, an interfacial film may be interposed between the first portion 140a and the second portion 140b of the gate electrode 140 and/or between the second portion 140b and the third portion 140c.

When an interfacial film is interposed between the first portion 140a and the second portion 140b of the gate electrode 140, the interfacial film may cover the entire upper surface of the first portion 140a of the gate electrode 140. When an interfacial film is disposed between the second portion 140b and the third portion 140c of the gate electrode 140, the interfacial film may cover the entire upper surface of the second portion 140b of the gate electrode 140.

The interfacial film may be of material having low resistance, such as tungsten nitride, titanium nitride, or cobalt silicide.

The gate electrode 140 may be of conductive material, e.g., a metal. For example, each of the first to third portions 140a, 140b, and 140c of the gate electrode 140 may include one metal selected from the group consisting of tungsten, aluminum, copper, molybdenum, titanium, tantalum and ruthenium. However, the present inventive concept is not limited thereto. For example, the material of the gate electrode 140 may have low resistance.

In some examples, at least one of the first to third portions 140a, 140b, and 140c of the gate electrode 140 includes impurity-doped polysilicon. For example, the third portion 140c of the gate electrode 140 may include n+ polysilicon, and the second portion 140b may include p+ polysilicon.

The gate electrodes 140 of FIG. 2 illustrate respective ones of the word lines (WL) in the layout of FIG. 1.

A barrier film 130 may be disposed in the gate trench 110 between the gate electrode 140 and the gate insulating film 112. The barrier film 130 may extend along at least a part of the bottom and sides of the gate trench 110. The barrier film 130 may extend, for example, to the interface between the capping film 122 and the gate electrode 140. However, the present inventive concept is not limited thereto. The barrier film 130 may, of course, further extend along the sides of the gate trench 110 to protrude beyond the interface between the capping film 122 and the gate electrode 140 and thereby extend between at least part of the capping film 122 and the gate insulating film 112.

The barrier film 130 includes a first barrier film pattern 131 disposed at the lower portion (of the gate electrode 140), a second barrier film pattern 133 disposed at the intermediate portion and above the first barrier film pattern 131, and a third barrier film pattern 135 disposed at the upper portion above the second barrier film pattern. The barrier film patterns may be referred to hereinafter as barrier patterns for short or as barrier films of material even though they are contiguous. Also, here the term "above" as the drawings makes clear refers to one barrier film pattern being above the level of an uppermost part of the other (lower) barrier film pattern.

The first barrier pattern 131 may be interposed between the first portion 140a of the gate electrode 140 and the gate insulating film 112. The first barrier pattern 131 may extend along a part of the upper side of the gate insulating film 112 on the gate insulating film 112. The first barrier pattern 131 may be disposed along part of the sides and along the bottom of the gate trench 110. More specifically, the first barrier pattern 131 may be disposed along the bottom and parts of both sides of the gate trench 110 as centered on the bottom of the gate trench 110.

The first portion 140a of the gate electrode 140 may be disposed on the first barrier pattern 131. That is, the first portion 140a of the gate electrode 140 may be disposed up to a level corresponding to the upper limit or end of the first barrier pattern 131. Accordingly, the uppermost part (upper end) of the first barrier pattern 131 and the uppermost part (top) of the first portion 140a of the gate electrode 140 may be disposed at substantially the same level in the device.

The second barrier pattern 133 may be disposed between the second portion 140b of the gate electrode 140 and the gate insulating film 112.

In some examples, the second barrier pattern 133 is disposed on the first barrier pattern 131 but not on the first portion 140a of the gate electrode 140. The second barrier pattern 133 may not extend between the first portion 140a of the gate electrode 140 and the second portion 140b of the gate electrode 140.

The second barrier pattern 133 may extend along parts of the sides of the gate trench 110 and in this respect may have the form of a trench liner. Accordingly, the second barrier pattern 133 may be disposed along part of the gate insulating film 112. The second barrier pattern 133 may extend along parts of both sides of the gate trench 110 as centered relative to the first barrier pattern 131 and top of the first portion 140a of the gate electrode 140. The second barrier pattern 133 may not extend between the first portion 140a of the gate electrode 140 and the first barrier pattern 131. The second portion 140b of the gate electrode 140 may be disposed up to a level corresponding to that of the upper end of the second barrier pattern 133. For example, the upper end of the second barrier pattern 133 and the top of the second portion 140b of the gate electrode 140 may be disposed at substantially the same level in the device.

The third barrier pattern 135 may be disposed between the third portion 140c of the gate electrode 140 and the gate insulating film 112.

In some examples, the third barrier pattern 135 is disposed on the second barrier pattern 133, but not on the second portion 140b of the gate electrode 140. The third barrier pattern 135 may not extend between the first portion 140a of the gate electrode 140 and the first barrier pattern 131. Also, the third barrier pattern 135 may not extend between the second portion 140b of the gate electrode 140 and the third portion 140c of the gate electrode 140.

The third barrier pattern 135 may extend along parts of the sides of the gate trench 110 and may have the form of a trench liner. That is, the third barrier pattern 135 may be disposed along part of the gate insulating film 112. The third barrier pattern 135 may extend along parts of both sides of the gate trench 110, as centered relative to the second barrier pattern 133 and the upper end of the second portion 140b of the gate electrode 140. The third barrier pattern 135 may not extend between the first portion 140a of the gate electrode 140 and the first barrier pattern 131. The third portion 140c of the gate electrode 140 may be disposed up to a level corresponding to the level of the upper end of the third barrier pattern 135. More specifically, the upper end of the third barrier pattern 135 and the top of the third portion 140c of the gate electrode 140 may be disposed at substantially the same level in the device.

Each of the first barrier pattern 131, the second barrier pattern 133, and the third barrier pattern 135 may be of different materials from each other. For example, the first barrier pattern 131, the second barrier pattern 133, and the third barrier pattern 135 may be of respective materials having different oxygen areal densities from each other.

The first barrier pattern 131 may include at least one of TiN, TaN, Ti, Ta, Mo, and Al, for example.

The second barrier pattern 133 may be of a second material having an oxygen areal density greater than the oxygen areal density of the first material constituting the first barrier pattern 131. In other words, the number of oxygen atoms per unit volume of the second material may be greater than the number of oxygen atoms per unit volume of the first material.

The third barrier pattern 135 may include a third material having an oxygen areal density smaller than the oxygen areal density of the first material constituting the first barrier pattern 131. In other words, the number of oxygen atoms per unit volume of the third material may be smaller than the number of oxygen atoms per unit volume of the first material.

In summary, the oxygen areal density of the first material may be greater than the oxygen areal density of the third material and less than the oxygen areal density of the second material.

The second barrier pattern 133 may be formed of one material selected from the group consisting of aluminum oxide, titanium oxide, hafnium oxide, zirconium oxide, and magnesium oxide, for example.

The third barrier pattern 135 may formed of one material selected from the group consisting of yttrium oxide, lanthanum oxide, germanium oxide, lutetium oxide, and strontium oxide, for example.

The work function of the first barrier pattern 131 (namely, a first work function), the work function of the second barrier pattern 133 (second work function), and the work function of the third barrier pattern 135 (third work function) may be different from each other. For example, the first work function may be greater than the third work function and smaller than the second work function. The work function may refer to the value of the work function as expressed in eV.

Figure 4:
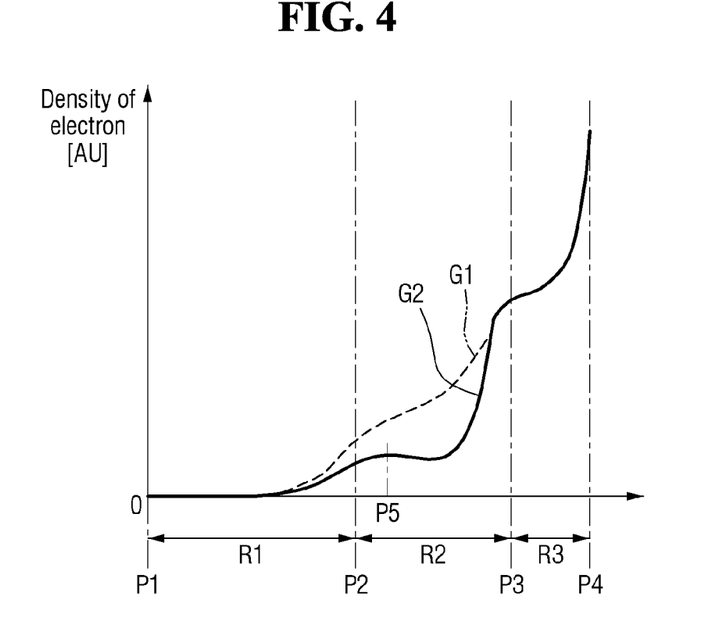
FIG. 4 is a graph of characteristics of an example of a semiconductor device according to the present inventive concept and of characteristics of an example of a semiconductor device for comparison with that according to the inventive concept.

FIG. 4 illustrates characteristics of a semiconductor device according to the present inventive concept.

The x-axis of the graph of FIG. 4 represents regions corresponding to each of the first to third portions 140a, 140b, and 140c of the gate electrode 140, respectively. For example, a first point (P1) on the x-axis of the graph of FIG. 4 corresponds to the lowest point of the first barrier pattern 131. A second point (P2) on the x-axis of the graph of FIG. 4 corresponds to the boundary between the first portion 140a of the gate electrode 140 and the second portion 140b of the gate electrode 140. Therefore, a first section (R1) on the x-axis of the graph of FIG. 4 corresponds to the first portion 140a of the gate electrode 140 and the first barrier pattern 131.

A third point (P3) on the x-axis of the graph of FIG. 4 corresponds to the boundary between the second portion 140b of the gate electrode 140 and the third portion 140c of the gate electrode 140. Therefore, the second section (R2) on the x-axis of the graph of FIG. 4 corresponds to the second portion 140b of the gate electrode 140 and the second barrier pattern 133.

A fourth point (P4) on the x-axis of the graph of FIG. 4 corresponds to the boundary between the capping film 122 and the gate electrode 140. Therefore, the third section (R3) on the x-axis of the graph of FIG. 4 corresponds to the third portion 140c of the gate electrode 140 and the third barrier pattern 135.

The y-axis of the graph of FIG. 4 represents the density (unit: AU (arbitrary unit)) of the electrons in the gate electrode 140.

The first plot G1 of FIG. 4 represents the electron concentration in each section, in a case where the work function of the intermediate barrier pattern is greater than the work function of the upper barrier pattern and less than the work function of the lower barrier pattern, in a semiconductor device including the barrier patterns having three different work functions.

The second plot G2 of FIG. 4 is a graph representing the electron concentration in each section, in a case where the work function of the lower barrier pattern (i.e., the first barrier pattern 131) is greater than the work function of the upper barrier pattern (i.e., the third barrier pattern 135) and less than the work function of the intermediate barrier pattern (i.e., the second barrier pattern 133) in a semiconductor device according to the present inventive concept.

Referring to FIG. 4, when a voltage is applied to the word line, the electron concentration may be very high in the vicinity of the upper barrier pattern (i.e., the third section (R3)). Because the work function of the upper barrier pattern is the lowest among the upper, intermediate and lower barrier patterns, electrons may move toward the vicinity of the lower barrier pattern (i.e., the first section (R1)).

At this time, because the work function of the intermediate barrier pattern is not relatively high in the second section (R2) of the device represented by the first plot G1, there may also be a low probability that the electrons coming down from the vicinity of the upper barrier pattern can be held.

On the other hand, the semiconductor device according to the present inventive concept may include first to third barrier patterns 131, 133, and 135 having different work functions from each other. As described above, the first work function may be greater than the third work function and less than the second work function. In the second section (R2) of the second plot G2, because the work function of the intermediate barrier pattern is relatively high, there may be a high probability that the electrons coming down from the upper barrier pattern can be held.

In other words, at the fifth point (P5) of the second section (R2), the concentration of electrons in the first plot G1 is higher than the concentration of electrons in the second plot G2. According to a device (comparative) having characteristics represented by the first plot G1, a relatively large amount of electrons may move to the vicinity of the lower barrier pattern. In this case, there is an increased probability of electrons flowing along an undesired path, which may lead to leakage current to reduce the reliability of the semiconductor device. On the other hand, in a device according to the inventive concept having characteristic represented by the second plot G2, a relatively small amount of electrons will move to the vicinity of the lower barrier pattern (i.e., the first barrier pattern 131). In this case, the possibility of leakage current occurring is minimized, and the reliability of the semiconductor device may be improved.

Referring again to FIGS. 1 to 3, a capping film 122 may fill the remaining part of the gate trench 110 in which the gate electrode 140 is formed. The capping film 122 may include at least one of silicon oxide, silicon nitride, and silicon oxynitride, for example.

A first source/drain region 107a may be disposed between two first gate electrodes 140. A second source/drain region 107b may be disposed between a gate electrode 140 and the device isolation film 105. That is, two transistors may be formed in the active region 103. At this time, the first source/drain region 107a may be shared by the two adjacent transistors, while the second source/drain region 107b is not shared by the two adjacent transistors.

A first interlayer insulating film 200a may be disposed on the substrate 100 to cover the gate electrode 140 and the device isolation film 105. The first interlayer insulating film 200a may include at least one of silicon oxide, silicon nitride and silicon oxynitride, for example. That is, the first interlayer insulating film 200a may be a monolayer or a multi-layered structure.

The first interlayer insulating film 200a may include a first contact hole 150 which exposes the first source/drain region 107a. That is, the first contact hole 150 may pass through the first interlayer insulating film 200a.

A bit line contact 160 may be formed in the first contact hole 150. The bit line contact 160 may include a conductive material, and may include, for example, at least one of polysilicon, a metal silicide compound, a conductive metal nitride, and a metal, but the present inventive concept is not limited thereto.

A bit line 170 electrically connected to the bit line contact 160 may be formed on the bit line contact 160. The bit line 170 may include a conductive material, and may include, for example, at least one of polysilicon, a metal silicide compound, a conductive metal nitride, and a metal, but the present inventive concept is not limited thereto. The bit line 170 of FIG. 2 is the same element as the bit line (BL) shown in the layout of FIG. 1.

A second interlayer insulating film 200b may be disposed on the first interlayer insulating film 200a to cover the bit line 170. The second interlayer insulating film 200b may include at least one of silicon oxide, silicon nitride, and silicon oxynitride, for example. The second interlayer insulating film 200b may be a monolayer or a multi-layered structure.

The second contact hole 180 may penetrate the first interlayer insulating film 200a and the second interlayer insulating film 200b to expose the second source/drain region 107b.

A storage node contact 190 may be formed in the second contact hole 180. The storage node contact 190 may be electrically connected to the second source/drain region 107b. The storage node contact 190 may include a conductive material, and may include, for example, at least one of polysilicon, a metal silicide compound, a conductive metal nitride, and a metal, but the present inventive concept is not limited thereto.

An information storage element may be formed on the storage node contact 190. The information storage element formed on the storage node contact 190 may be, for example, a capacitor, and may include a storage node being in contact with the storage node contact 190. Alternatively, the information storage element may be a variable resistor. Specifically, the information storage element may include a phase change material or may be a magnetic tunnel joining pattern.

Hereinafter, other examples of a semiconductor device according to the present inventive concept will be described with reference to FIGS. 1, 5, and 6. The parts of the aforementioned description that equally apply to these examples will be simplified or omitted for the sake of brevity.

Figure 5:
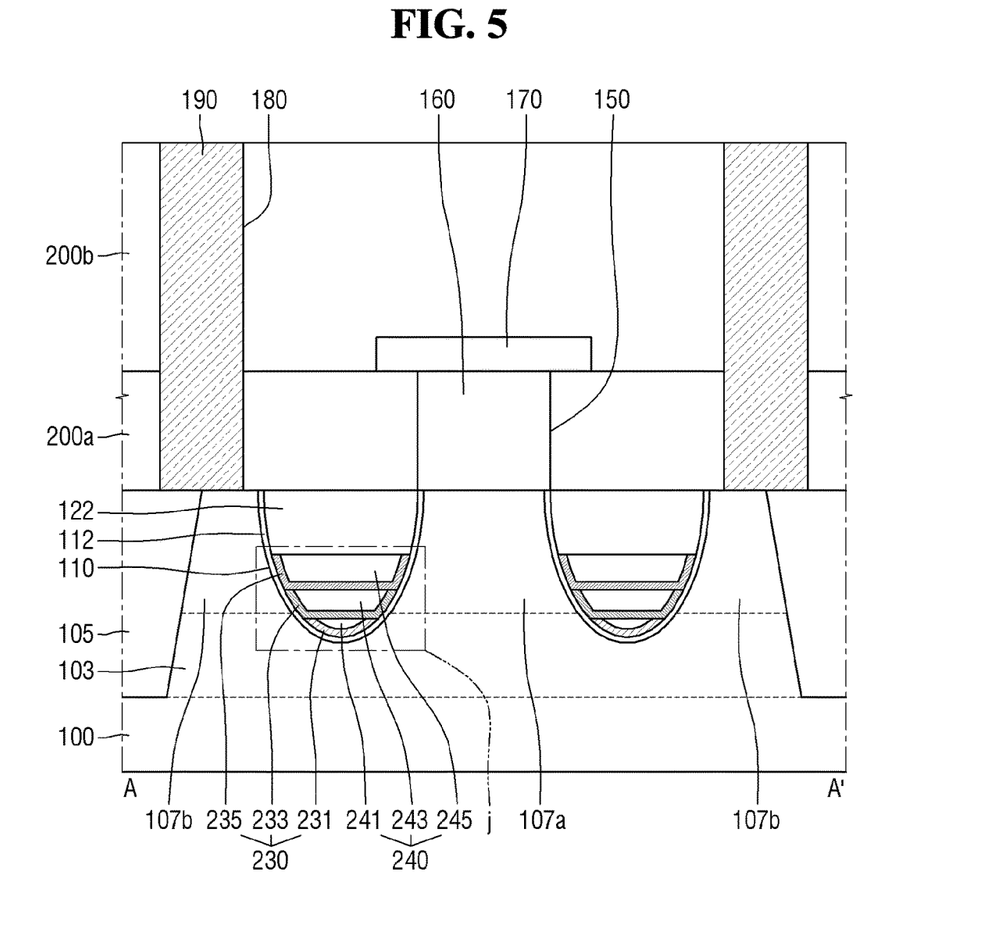
FIG. 5 is a cross-sectional view of an example of a semiconductor device according to the inventive concept, as taken along line A-A' of FIG. 1.

FIG. 5 is a cross-sectional view taken along line A-A' of FIG. 1. FIG. 6 is an enlarged view of a region j of FIG. 5.

Figure 6:
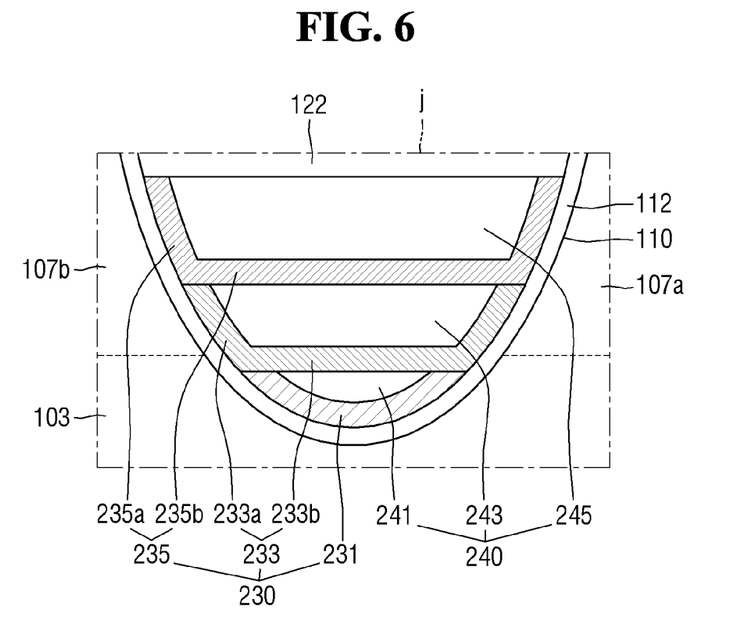
FIG. 6 is an enlarged view of a region j of FIG. 5.

Referring to FIGS. 5 and 6, a semiconductor device according to the present inventive concept may include a barrier film 230 and a gate electrode 240.

The barrier film 230 may include a first barrier film pattern 231, a second barrier film pattern 233, and a third barrier film pattern 235 each of which will be referred to as a barrier film pattern for short. The gate electrode 240 may have a first portion 241, a second portion 243, and a third portion 245.

The first barrier pattern 231 may be disposed along part of the sides and the bottom of the gate trench 110. The first barrier pattern 231 may correspond to, for example, the above-described first barrier pattern 131. The first portion 241 of the gate electrode 240 may be disposed on the first barrier pattern 231. The first portion 241 of the gate electrode 240 may correspond to, for example, the first portion 140a of the above-described gate electrode 140.

The second barrier pattern 233 may include a first portion 233a and a second portion 233b. The first portion 233a of the second barrier pattern 233 may be a portion which is disposed on the first barrier pattern 231 and extends along a part of the gate insulating film 112 (that is, parts of the sides of the gate trench 110). The first portion 233a of the second barrier pattern 233 may correspond to, for example, the above-described second barrier pattern 133. The second portion 233b of the second barrier pattern 233 may be disposed on the first portion 241 of the gate electrode 240. The second portion 233b of the second barrier pattern 233 may be interposed between the first portion 241 of the gate electrode 240 and the second portion 243 of the gate electrode 240.

The second portion 243 of the gate electrode 240 may be disposed on the second barrier pattern 233. The second portion 243 of the gate electrode 240 may correspond to, for example, the second portion 140b of the above-described gate electrode 140. However, the second portion 243 of the gate electrode 240 may be of a material different from the first portion 241 of the gate electrode 240.

The third barrier pattern 235 may include a first portion 235a and a second portion 235b. The first portion 235a of the third barrier pattern 235 may be a portion which is disposed on the second barrier pattern 233 and extends along a part of the gate insulating film 112 (that is, parts of the sides of the gate trench 110). The first portion 235a of the third barrier pattern 235 may correspond to, for example, the above-described third barrier pattern 135. The second portion 235b of the third barrier pattern 235 may include a portion disposed on the second portion 243 of the gate electrode 240. The second portion 235b of the third barrier pattern 235 may be interposed between the second portion 243 of the gate electrode 240 and the third portion 245 of the gate electrode 240.

In some examples, the second portion 235b of the third barrier pattern 235 may be of a different material from the first portion 235a. The second portion 235b of the third barrier pattern 235 may be of a material having low resistance, such as, tungsten nitride, titanium nitride, or cobalt silicide.

A third portion 245 of the gate electrode 240 may be disposed on the third barrier pattern 235. The third portion 245 of the gate electrode 240 may correspond to, for example, the third portion 140c of the above-described gate electrode 140. However, the third portion 245 of the gate electrode 240 may be of material different from that of each of the first portion 241 and the second portion 243 of the gate electrode 240.

The work function of the first barrier pattern 231 may be smaller than the work function of the second barrier pattern 233 and may be greater than the work function of the third barrier pattern 235. For example, the oxygen areal density of the material of the first barrier pattern 231 may be smaller than the oxygen areal density of the material of the second barrier pattern 233, and may be greater than the oxygen areal density of the material of the third barrier pattern 235.

Hereinafter, another example of a semiconductor device according to the present inventive concept will be described with reference to FIGS. 1, 7, and 8. The parts of the aforementioned description that apply equally this example will be simplified or omitted for brevity.

Figure 7:
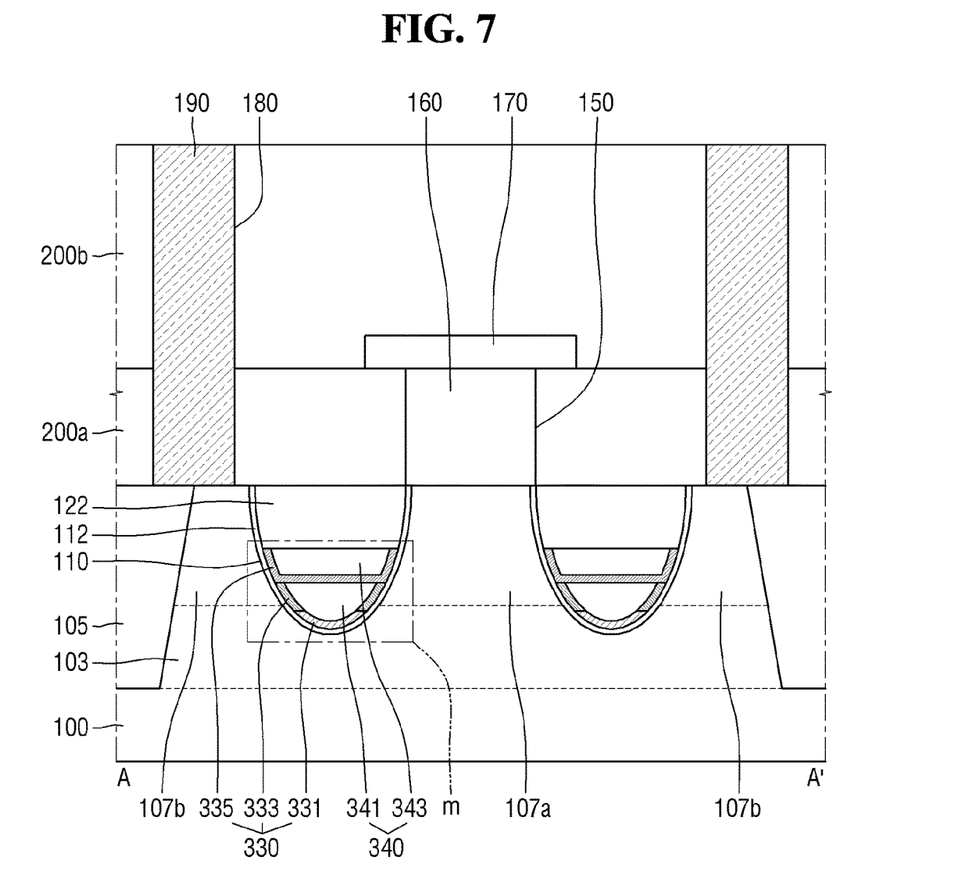
FIG. 7 is a cross-sectional view of an example of a semiconductor device according to the inventive concept, as taken along line A-A' of FIG. 1.

FIG. 7 is a cross-sectional view taken along line A-A' of FIG. 1. FIG. 8 is an enlarged view of the region m of FIG. 7.

Figure 8:
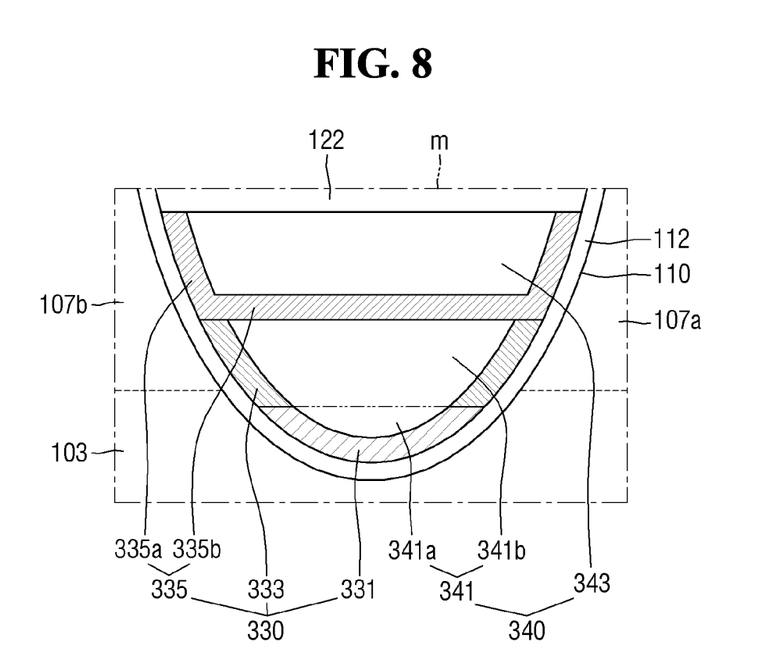
FIG. 8 is an enlarged view of a region m of FIG. 7.

Referring to FIGS. 7 and 8, the semiconductor device according to the present inventive concept may include a barrier film 330 and a gate electrode 340.

The barrier film 330 may include a first barrier pattern 331, a second barrier pattern 333, and a third barrier pattern 335. The gate electrode 340 may include a first portion 341 and a second portion 343. The first portion 341 of the third gate electrode 340 may include a first part 341a and a second part 341b.

The first barrier pattern 331 may be disposed along a part of the side and the bottom of the gate trench 110. The first barrier pattern 331 may correspond to, for example, the above-described first barrier pattern 131.

The first portion 341 of the gate electrode 340 may be disposed on the first barrier pattern 331. The first part 341a of the first portion 341 of the third gate electrode 340 may correspond to, for example, the first portion 140a of the above-mentioned gate electrode 140.

The second part 341b of the first portion 341 of the third gate electrode 340 may be disposed on the first part 341a of the first portion 341 of the third gate electrode 340. The second part 341b of the first portion 341 of the third gate electrode 340 may correspond to, for example, the second portion 140b of the above-described gate electrode 140.

In some examples, the first part 341a of the first portion 341 of the third gate electrode 340 may be of the same material as the second part 341b.

In some examples, the first part 341a of the seventh part 341 of the third embodiment 340 may be of a different kind of material from the second part 341b. In this case, an interfacial film may be interposed between the first part 341a and the second part 341b.

The second barrier pattern 333 may be disposed on the first barrier pattern 331 and extend along a part of the gate insulating film 112 (that is, parts of the sides of the gate trench 110). The second barrier pattern 333 may correspond to, for example, the above-described second barrier pattern 133. The second barrier pattern 333 may not extend between the first part 341a and the second part 341b of the first portion 341 of the third gate electrode 340. The second barrier pattern 333 may be disposed between the gate insulating film 112 and the second part 341b of the first portion 341 of the third gate electrode 340.

The third barrier pattern 335 may include a first portion 335a and a second portion 335b. The first portion 335a of the third barrier pattern 335 may correspond to the first portion 235a of the third barrier pattern 235. The second portion 335b of the third barrier pattern 335 may correspond to the second portion 235b of the third barrier pattern 235. For example, the second portion 335b of the third barrier pattern 335 may extend between the second part 341b of the first portion 341 of the third gate electrode 340 and the second portion 343 of the third gate electrode 340.

In some examples, the first portion 335a and the second portion 335b of the third barrier pattern 335 may be of the same material.

In some examples, the first portion 335a and the second portion 335b of the third barrier pattern 335 may be of different materials from each other. In this case, the second portion 335b of the third barrier pattern 335 may be of material having low resistance such as tungsten nitride, titanium nitride, or cobalt silicide.

The second portion 343 of the third gate electrode 340 may be disposed on the third barrier pattern 335. The second portion 343 of the third gate electrode 340 may correspond to, for example, the third portion 140c of the above-described gate electrode 140. However, the second portion 343 of the third gate electrode 340 may be of material different from that of the first portion 341 of the third gate electrode 340.

The work function of the first barrier pattern 331 may be smaller than the work function of the second barrier pattern 333 and may be greater than the work function of the third barrier pattern 335. For example, the oxygen areal density of the material of the first barrier pattern 331 may be less than the oxygen areal density of the material of the second barrier pattern 333, and may be greater than the oxygen areal density of the material of the third barrier pattern 335.

Hereinafter, another example of a semiconductor device according to the present inventive concept will be described with reference to FIGS. 1, 9, and 10. The parts of the aforementioned description that apply equally to this example will be simplified or omitted for brevity.

Figure 9:
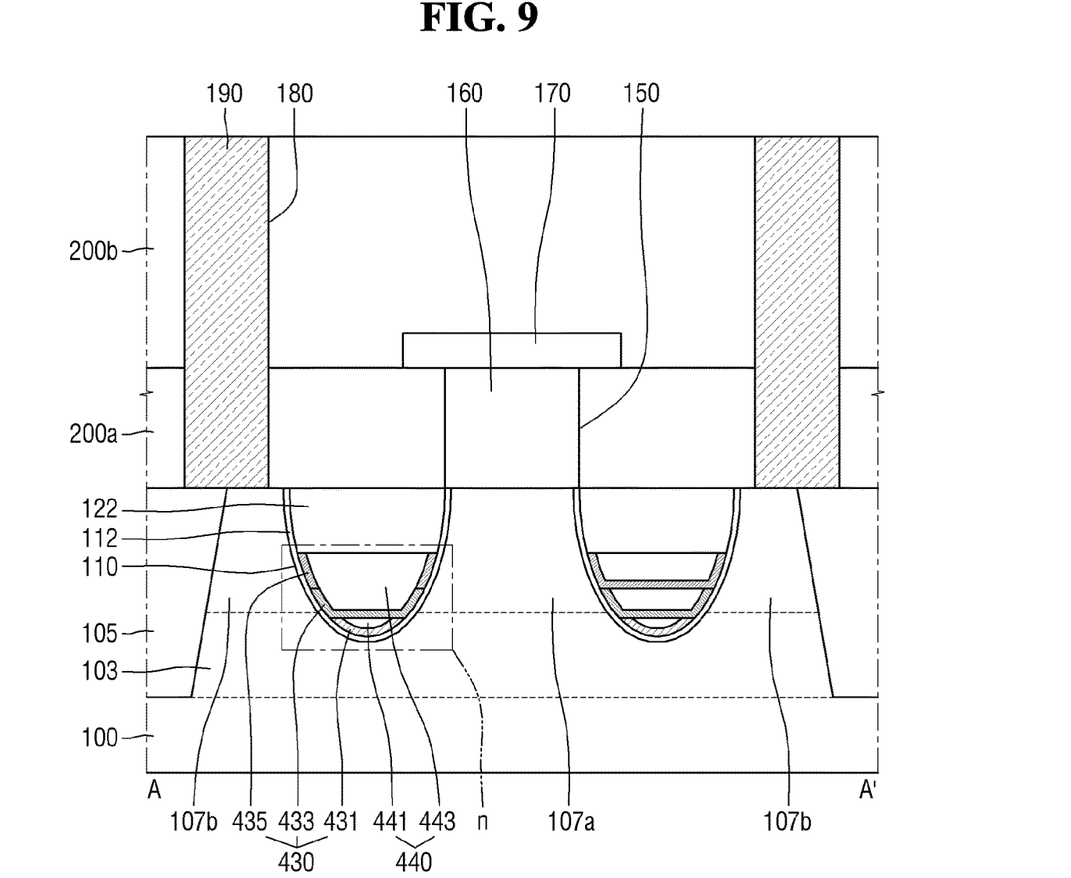
FIG. 9 is a cross-sectional view of an example of a semiconductor device according to the inventive concept, as taken along line A-A' of FIG. 1.

FIG. 9 is a cross-sectional view taken along line A-A' of FIG. 1. FIG. 10 is an enlarged view of the region n of FIG. 9.

Figure 10:
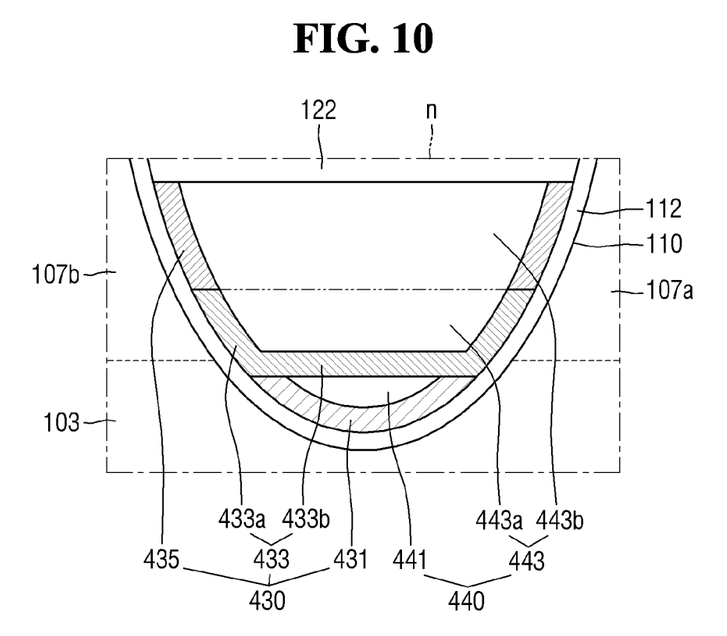
FIG. 10 is an enlarged view of a region n of FIG. 9.

Referring to FIGS. 9 and 10, the semiconductor device may include a barrier film 430 and a gate electrode 440.

The barrier film 430 may include a first barrier pattern 431, a second barrier pattern 433, and a third barrier pattern 435. The gate electrode 440 may include a first portion 441 and a second portion 443. The second portion 443 of the gate electrode 440 may include a first part 443a and a second part 443b.

The first barrier pattern 431 may be disposed along parts of the sides and the bottom of the gate trench 110. The first barrier pattern 431 may correspond to, for example, the above-described first barrier pattern 131.

The first portion 441 of the gate electrode 440 may be disposed on the first barrier pattern 431. The first portion 441 of the gate electrode 440 may correspond to, for example, the first portion 140a of the above-described gate electrode 140.

The second barrier pattern 433 may include a first portion 433a and a second portion 433b. The first portion 433a of the second barrier pattern 433 may correspond to the first portion 233a of the second barrier pattern 233. The second portion 433b of the second barrier pattern 433 may correspond to the second portion 233b of the second barrier pattern 233. For example, the second portion 433b of the second barrier pattern 433 may extend between the first portion 441 and the second portion 443 of the gate electrode 440.

The third barrier pattern 435 may be disposed on the second barrier pattern 433 and extend along a part of the gate insulating film 112 (that is, parts of the sides of the gate trench 110). The third barrier pattern 435 may correspond to, for example, the above-described third barrier pattern 135. That is, the third barrier pattern 435 may not extend between the second part 443b of the second portion 443 of the gate electrode 440 and the first part 443a. The third barrier pattern 435 may be disposed between the second part 443b of the second portion 443 of the gate electrode 440 and the gate insulating film 112.

The first part 443a of the second portion 443 of the gate electrode 440 may be disposed on the second barrier pattern 433. The top of the first part 443a of the second portion 443 of the gate electrode 440 may be located on substantially the same plane as the top (upper end) of the second barrier pattern 433. The second part 443b of the second portion 443 of the gate electrode 440 may be disposed on the first part 443a.

In some examples, the first part 443a and the second part 443b of the second portion 443 of the gate electrode 440 may be of the same material.

In some examples, the first part 443a and the part portion 443b of the second portion 443 of the gate electrode 440 may be of different kinds of material. In this case, an interfacial film may be further disposed between the first part 443a and the second part 443b.

The work function of the first barrier pattern 431 may be smaller than the work function of the second barrier pattern 433 and may be greater than the work function of the third barrier pattern 435. For example, the oxygen areal density of the material contained in the first barrier pattern 431 may be less than the oxygen areal density of the material of the second barrier pattern 433, and may be greater than the oxygen areal density of the material of the third barrier pattern 435.

Although the present inventive concept has been particularly shown and described with reference to various examples thereof, it will be understood by those of ordinary skill in the art that various changes in form and details may be made to such examples without departing from the spirit and scope of the present inventive concept as defined by the following claims. It is therefore desired that the present disclosure be considered in all respects as illustrative and not restrictive, reference being made to the appended claims rather than the foregoing description to indicate the scope of the invention.

What is claimed is:

1. A semiconductor device comprising:
a substrate and a device isolation film defining an active region of the substrate, the active region having a gate trench therein;
a gate insulating film disposed along sides and a bottom of the gate trench;
a gate electrode disposed on the gate insulating film and occupying at least a part of the gate trench not occupied by the gate insulating film, the gate electrode having a first portion, a second portion on the first portion, and a third portion on the second portion;
a first barrier film pattern interposed between the first portion of the gate electrode and the gate insulating film, the first barrier film pattern having a first work function;
a second barrier film pattern interposed between the second portion of the gate electrode and the gate insulating film, the second barrier film pattern having a second work function;
a third barrier film pattern interposed between the third portion of the gate electrode and the gate insulating film, the third barrier film pattern having a third work function,
wherein the first work function is larger than the third work function and smaller than the second work function.

2. The semiconductor device of claim 1, wherein the first, second and third barrier film patterns have oxygen areal densities in which the oxygen areal density of the first barrier film pattern is greater than the oxygen areal density of the third barrier film pattern, and the oxygen areal density of the first barrier film pattern is lower than the oxygen areal density the second barrier film pattern.

3. The semiconductor device of claim 1, wherein the second and third barrier film patterns do not extend into the gate electrode.

4. The semiconductor device of claim 1, wherein the second and third barrier film patterns do not extend between the first portion of the gate electrode and the first barrier film pattern.

5. The semiconductor device of claim 1, wherein the second barrier film pattern extends between the first portion of the gate electrode and the second portion of the gate electrode.

6. The semiconductor device of claim 1, wherein the third barrier film pattern extends between the second portion of the gate electrode and the third portion of the gate electrode.

7. A semiconductor device comprising:
a substrate and a device isolation film defining an active region of the substrate, the active region having a gate trench therein;
a gate insulating film disposed along sides and a bottom of the gate trench;
a gate electrode disposed on the gate insulating film and occupying at least a part of the gate trench not occupied by the gate insulating film, the gate electrode having a first portion, a second portion on the first portion, and a third portion on the second portion;
a first barrier film pattern, of first material, interposed between the first portion of the gate electrode and the gate insulating film;
a second barrier film pattern, of second material, interposed between the second portion of the gate electrode and the gate insulating film;
a third barrier film pattern, of third material, interposed between the third portion of the gate electrode and the gate insulating film,
the first and second materials having oxygen areal densities wherein the oxygen areal density of the second material is greater than the oxygen areal density of the first material.

8. The semiconductor device of claim 7, wherein oxygen areal densities of the first, second and third materials are such the oxygen areal density of the third material is lower than the oxygen areal density of each of the first and second materials.

9. The semiconductor device of claim 7, wherein the first barrier film pattern has a work function larger than that of the third barrier film pattern and smaller than that of the second barrier film pattern.

10. The semiconductor device of claim 7, wherein the second and third barrier film patterns do not extend into the gate electrode.

11. The semiconductor device of claim 7, wherein the second and third barrier film patterns do not extend between the first portion of the gate electrode and the first barrier film pattern.

12. The semiconductor device of claim 7, wherein the second barrier film pattern extends between the first portion of the gate electrode and the second portion of the gate electrode.

13. The semiconductor device of claim 7, wherein the third barrier film pattern extends between the second portion of the gate electrode and the third portion of the gate electrode.

* * * * *